United States Patent
Lin et al.

(10) Patent No.: US 8,503,500 B2
(45) Date of Patent: Aug. 6, 2013

(54) ALTERNATING CURRENT LIGHT EMITTING DEVICE

(75) Inventors: Ming-Te Lin, Hsinchu Hsien (TW);
Hsi-Hsuan Yen, Hsinchu Hsien (TW);
Wen-Yung Yeh, Hsinchu Hsien (TW);
Ming-Yao Lin, Hsinchu Hsien (TW);
Sheng-Pan Huang, Hsinchu Hsien (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 12/021,072

(22) Filed: Jan. 28, 2008

(65) Prior Publication Data

US 2008/0136347 A1 Jun. 12, 2008

Related U.S. Application Data

(62) Division of application No. 11/245,255, filed on Oct. 7, 2005, now Pat. No. 7,474,681.

(30) Foreign Application Priority Data

May 13, 2005 (CN) .................................. 94 1 15514

(51) Int. Cl.
*H01S 3/14* (2006.01)

(52) U.S. Cl.
USPC ........... 372/68; 372/43.01; 315/246; 315/250

(58) Field of Classification Search
USPC .......... 372/68, 43.01; 315/250, 246; 257/13, 257/79
See application file for complete search history.

(56) References Cited

U.S. PATENT DOCUMENTS

| | | | |
|---|---|---|---|
| 5,060,028 A * | 10/1991 | Kuo et al. | 257/13 |
| 6,797,984 B1 * | 9/2004 | Lin et al. | 257/82 |
| 6,957,899 B2 * | 10/2005 | Jiang et al. | 362/84 |
| 7,042,921 B2 * | 5/2006 | Witzigmann et al. | 372/96 |
| 7,210,819 B2 * | 5/2007 | Jiang et al. | 362/249.02 |
| 2003/0160254 A1 * | 8/2003 | Henrichs | 257/88 |
| 2004/0075399 A1 * | 4/2004 | Hall | 315/291 |
| 2004/0080941 A1 | 4/2004 | Jiang et al. | |
| 2004/0246696 A1 | 12/2004 | Yoo | |
| 2005/0001537 A1 | 1/2005 | West | |
| 2005/0230693 A1 * | 10/2005 | Chen | 257/89 |
| 2005/0253151 A1 * | 11/2005 | Sakai et al. | 257/79 |
| 2005/0254243 A1 * | 11/2005 | Jiang et al. | 362/249 |
| 2006/0044864 A1 * | 3/2006 | Lin et al. | 365/151 |

FOREIGN PATENT DOCUMENTS

| | | |
|---|---|---|
| DE | 101 03 422 A1 | 8/2002 |
| JP | 2004-333583 A | 11/2004 |
| WO | WO 2005015640 A1 * | 2/2005 |

OTHER PUBLICATIONS

Office Action from the German Patent Office, issued Nov. 14, 2008, in German Patent Application No. 10 2006 021 648.2-33, and English translation thereof.

* cited by examiner

*Primary Examiner* — Yuanda Zhang
(74) *Attorney, Agent, or Firm* — Finnegan, Henderson, Farabow, Garrett & Dunner, LLP

(57) ABSTRACT

A light emitting device and the fabrication method includes forming one or more light emitting modules on a substrate. The light emitting module receives an alternating current input and has at least two micro diodes. Each micro diode has at least two active layers and is electrically connected by a conductive structure so as to allow the active layers of the micro diodes to alternately emit light during positive and negative cycles of the alternating-current input.

12 Claims, 28 Drawing Sheets

ALTERNATING CURRENT LIGHT EMITTING DEVICE

CROSS-REFERENCE TO RELATED APPLICATION

This application is a divisional of co-pending U.S. patent application Ser. No. 11/245,255 filed Oct. 7, 2005, which claims priority to Chinese Patent Application No. 094115514 filed May 13, 2005 which is incorporated herein by reference.

BACKGROUND

1. Field of the Invention

The present invention relates to a light-emitting device, and more particularly, to an alternating current light emitting device and the fabrication method thereof.

2. Description of Related Art

Unlike white light which is a mixture of different colors, light emitting diodes (LEDs) emit monochromatic light by applying electric current to a radiating material to produce a light described as a cold light since it is produced at a relatively low temperature. Due to the superiority of light emitting diodes in terms of their relative high durability, longevity, portability, low power consumption, absence of harmful substances such as mercury, and so forth, the development of LED-based solid state lighting has become one of the crucial research targets for the global lighting industry as well as the semiconductor industry. Often-seen applications of LEDs include white light illumination (using red, blue, and green LEDs), indicator lights, vehicle signal and illuminating lights, flash lights, LED back-light modules, projector light sources, outdoor displays, and so forth.

BRIEF SUMMARY

The present invention is accomplished in order to improve the shortcomings disclosed in the prior art. The present invention provides a light emitting device. The device may include a substrate, a light emitting module and a conductive structure. The light emitting module is configured to receive an alternating-current input and is formed on the substrate. The light emitting module has at least two micro diodes. Each micro diode has at least two active layers. The conductive structure is formed between the two micro diodes and is electrically connected to each micro diode, allowing the active layers of each micro diode to take turns emitting light during the positive and negative half cycles of alternating current.

The present invention may also provide a novel alternating current light emitting device. The present invention provides a light emitting device. The device may include a substrate, a light emitting module and a conductive structure. The light emitting module is configured to receive an alternating-current input and is formed on the substrate. The light emitting module has a plurality of micro diodes. Each micro diode has at least two active layers. The conductive structure is formed between the micro diodes and is electrically connected to each micro diode, allowing the active layers of each micro diode to take turns emitting light during the positive and negative half cycles of alternating current.

Further scope of the applicability of the present invention will become apparent from the detailed description given hereinafter. However, it should be understood that the detailed description and specific examples, while indicating embodiments of the invention, are given by way of illustration only, since various changes and modifications within the spirit and scope of the invention will become apparent to those skilled in the art from this detailed description.

BRIEF DESCRIPTION OF DRAWINGS

The various objectives and advantages of the present invention can be fully understood by reading the following detailed description with reference made to the accompanying drawings, which are given by way of illustration only, and thus are not limitative of the present invention, and wherein.

DETAILED DESCRIPTION

The present invention discloses an alternating current light emitting device applicable to a chip, the alternating current light emitting device being capable of generating white light or colored light by externally applied alternating current power, the invention being capable of emitting the white light or colored light full time from the light-emitting surface of the chip. The invention may achieve one or more objectives. For example, the present invention may provide a novel alternating current light emitting device and the fabrication method thereof that has a full scale light emitting area and also can emit light full time. The invention may also provide a novel alternating current light emitting device and the fabrication method thereof that has a reduced size or can emit light more evenly. Generally the voltage of alternating current may be 110V or 220V and the frequency of alternating current may be 60 Hz or 50 Hz.

Figure 1A:
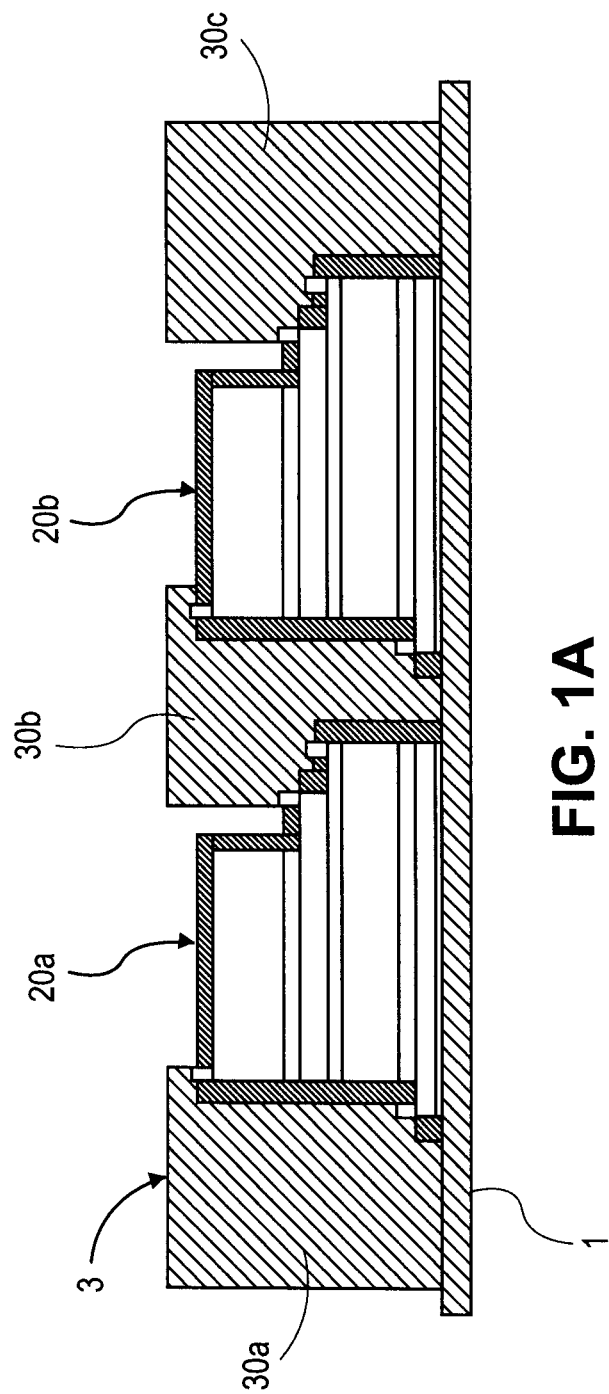
FIGS. 1A and 1B are, respectively, a schematic cross-sectional view and a partially enlarged view of an alternating current light emitting device according to the present invention.
Figure 1B:
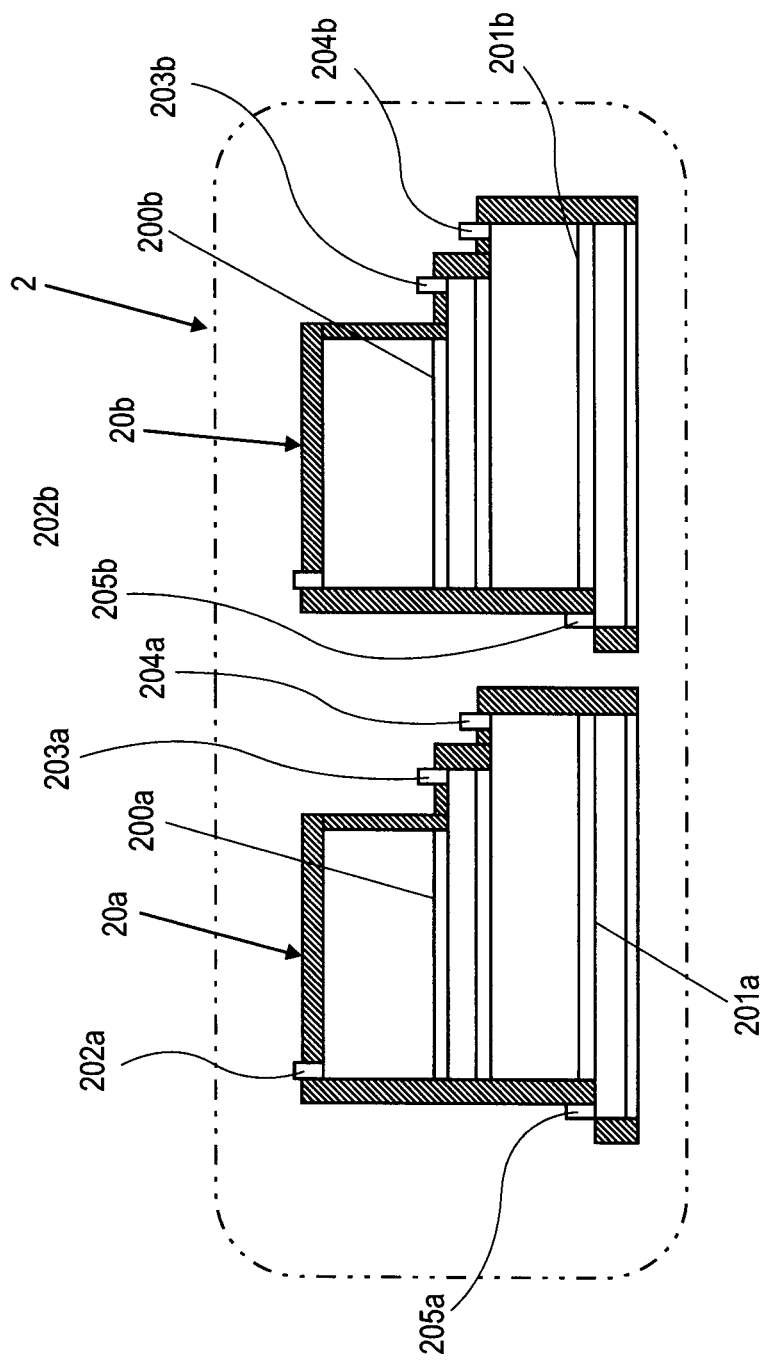

FIGS. 1A and 1B each show a cross-sectional view of the structure of the alternating current light emitting device of the present invention. The drawings depict only one single alternating current light emitting device in this embodiment. The alternating current light emitting device at least comprises a substrate 1, an alternating current micro diode light emitting module 2 formed on the substrate 1, and a conductive structure 3 for providing an electrical connection between micro diodes (e.g. a micro diode 20a and a micro diode 20b).

In this embodiment, the substrate 1 can be the chip as mentioned above, or an insulating substrate, such as Al.sub.2O.sub.3, GaAs, GaP, SiC, and so forth.

FIG. 1B is enlarged to clearly illustrate the alternating current micro diode light emitting module 2, which comprises at least the micro diodes 20a and 20b. Each micro diode further comprises at least two active layers, namely, the upper active layers 200a and 200b and the lower active layers 201a and 201b as shown in the FIG. 1B, wherein the active layers are light-emitting active layers. Active layers (e.g. the active layers 200a and 201a of the micro diode 20a, and the active layers 200b and 201b of the micro diode 20b) may have individual ohmic electrodes, such as 202a, 202b, 203a, 203b, 204a, 204b, 205a and 205b, so that the active layers 200a, 201a, 200b and 201b may emit light by applying alternating current to the micro diodes 20a and 20b through these ohmic electrodes 202a, 202b, 203a, 203b, 204a, 204b, 205a and 205b. In addition, each micro diode formed on the substrate 1 having at least two active layers can be fabricated by a flip-chip, wafer bonding or chip-stacked technique.

The conductive structure 3 electrically connects micro diodes 20a and 20b, so that the active layers may take turns to emit light during the positive/negative half cycles of alternating current, wherein the conductive structure 3 at least comprises a conductor (e.g. a conductor 30b) connected between the two micro diodes 20a and 20b, as shown in FIG. 1A. The conductive structure 3 may further comprise conductors 30a and 30c for transmitting alternating current, and, in this embodiment, the conductors 30a, 30b, and 30c are preferably conductive bridges.

The operation of the alternating current light emitting device of the invention will be described in the following embodiments with reference to FIGS. 2A and 2B and FIGS. 3A and 3B.

Figure 2A:
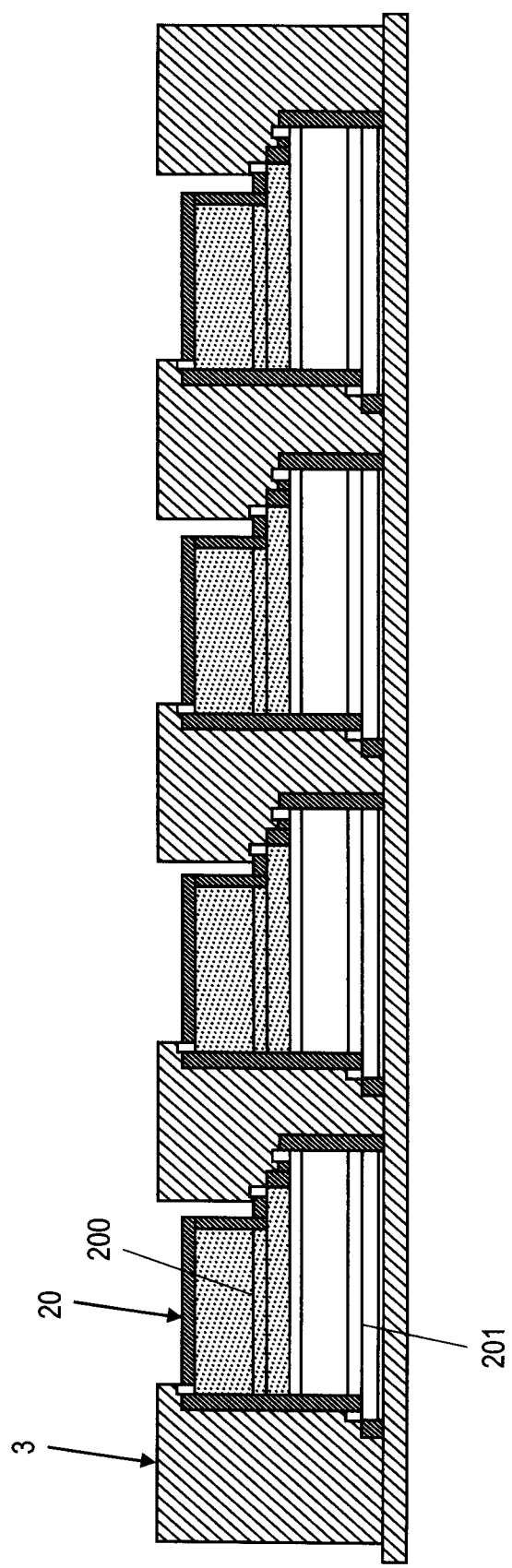
FIGS. 2A and 2B are schematic views illustrating an operation of an embodiment of the alternating current light emitting device according to the present invention.
Figure 2B:
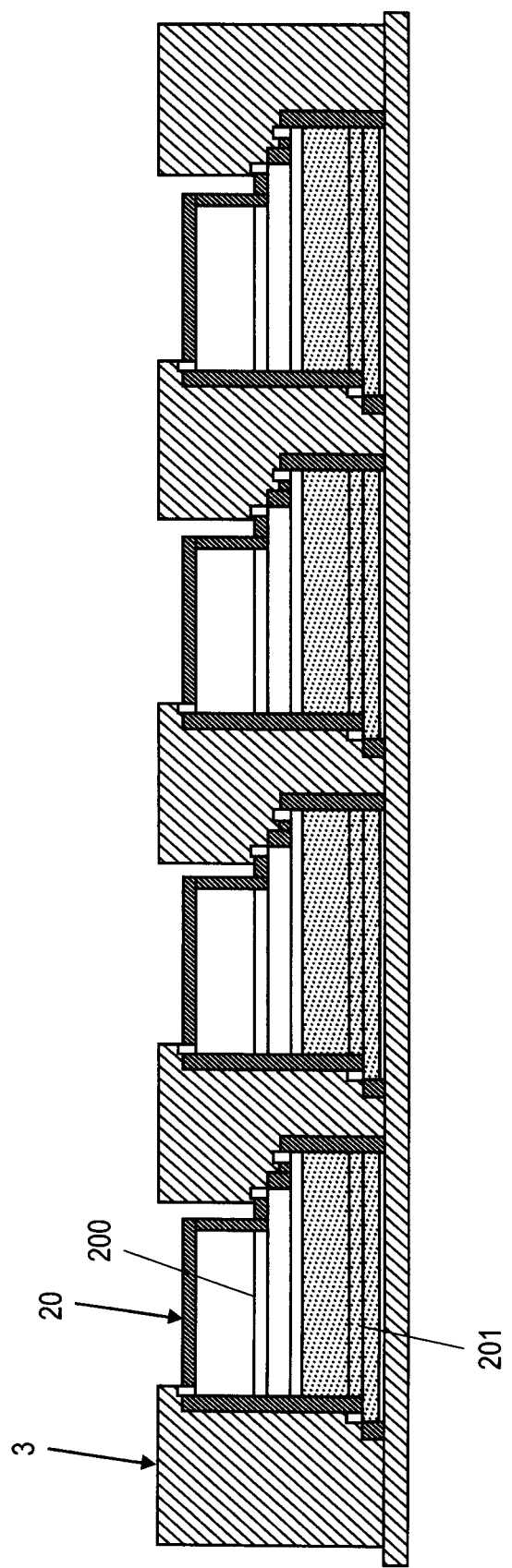
Figure 3A:
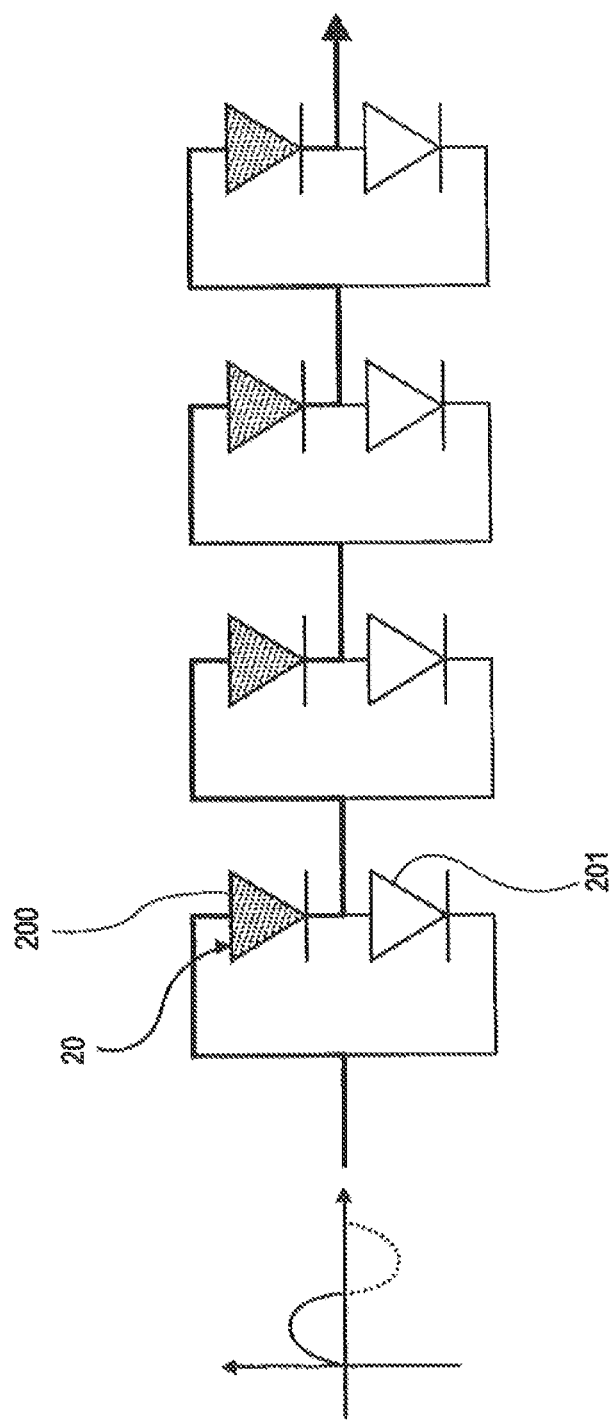
FIGS. 3A and 3B show the respective circuitry of FIGS. 2A and 2B illustrating the operation of an embodiment of the alternating current light emitting device according to the present invention.
Figure 3B:
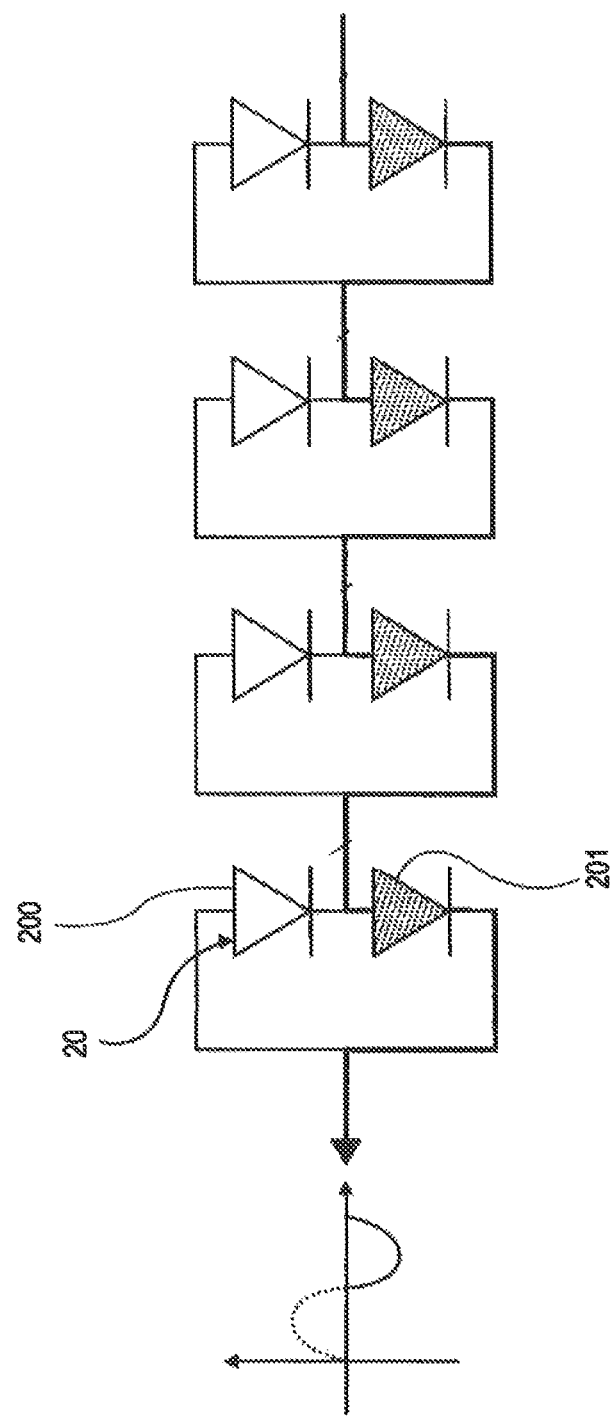

FIGS. 2A and 2B show the status of the alternating current light emitting device being applied with alternating current. FIGS. 3A and 3B are equivalent circuitry of the alternating current light emitting device, each respectively corresponding to the alternating current light emitting device illustrated in FIGS. 2A and 2B, wherein each active layer (e.g. an upper active layer 200 and a lower active layer 201) may be equivalent to a light emitting diode having a P/N structure, thereby there is a parallel electrical connection between the upper active layer 200 and the lower active layer 201 of each micro diode 20, and the micro diodes 20 are serially electrically connected by the conductive structure 3, as shown in FIGS. 3A and 3B.

FIGS. 2A and 3A show a radiant status while the positive half cycle of alternating current flows through the alternating current light emitting device. During the positive half cycles of alternating current, the upper active layers (e.g. the upper active layer 200) of the micro diodes (e.g. the micro diode 20) are forward biased. As a result, the positive half cycle of current, as shown in an arrow of FIG. 3A, may across the upper active layers and may enable the upper active layers (e.g. the upper active layer 200) of the micro diodes (e.g. the micro diode 20) to emit light. Similarly, with reference to FIGS. 2B and 3B, during the negative half cycles of alternating current thereto, the lower active layers (e.g. the lower active layer 201) of the micro diodes (e.g. the micro diode 20) are forward biased, as a consequence, the negative half cycle of current, as shown in an arrow of FIG. 3B, may flow through the lower active layers and may enable the lower active layers (e.g. the lower active layer 201) of the micro diodes (e.g. the micro diode 20) to emit light. In other words, as can be seen from the equivalent circuitry, the active layers of each micro diode (e.g. the upper active layer 200 and the lower active layer 201 of the micro diode 20) may be equivalent to two light emitting diodes (LEDs) with opposite biased directions for receiving the positive/negative half cycles of alternating current. Thereby enabling the alternating current light emitting device of the invention to emit light during the positive half cycles or negative half cycles of alternating current flowing through the device, and also enabling the same active layers of micro diodes to take turns to emit light during the positive and negative half cycles of alternating current. (e.g. all the upper active layers emit light during a positive half cycles of alternating current or all the lower active layers emit light during a negative half cycles of alternating current)

Figure 4:
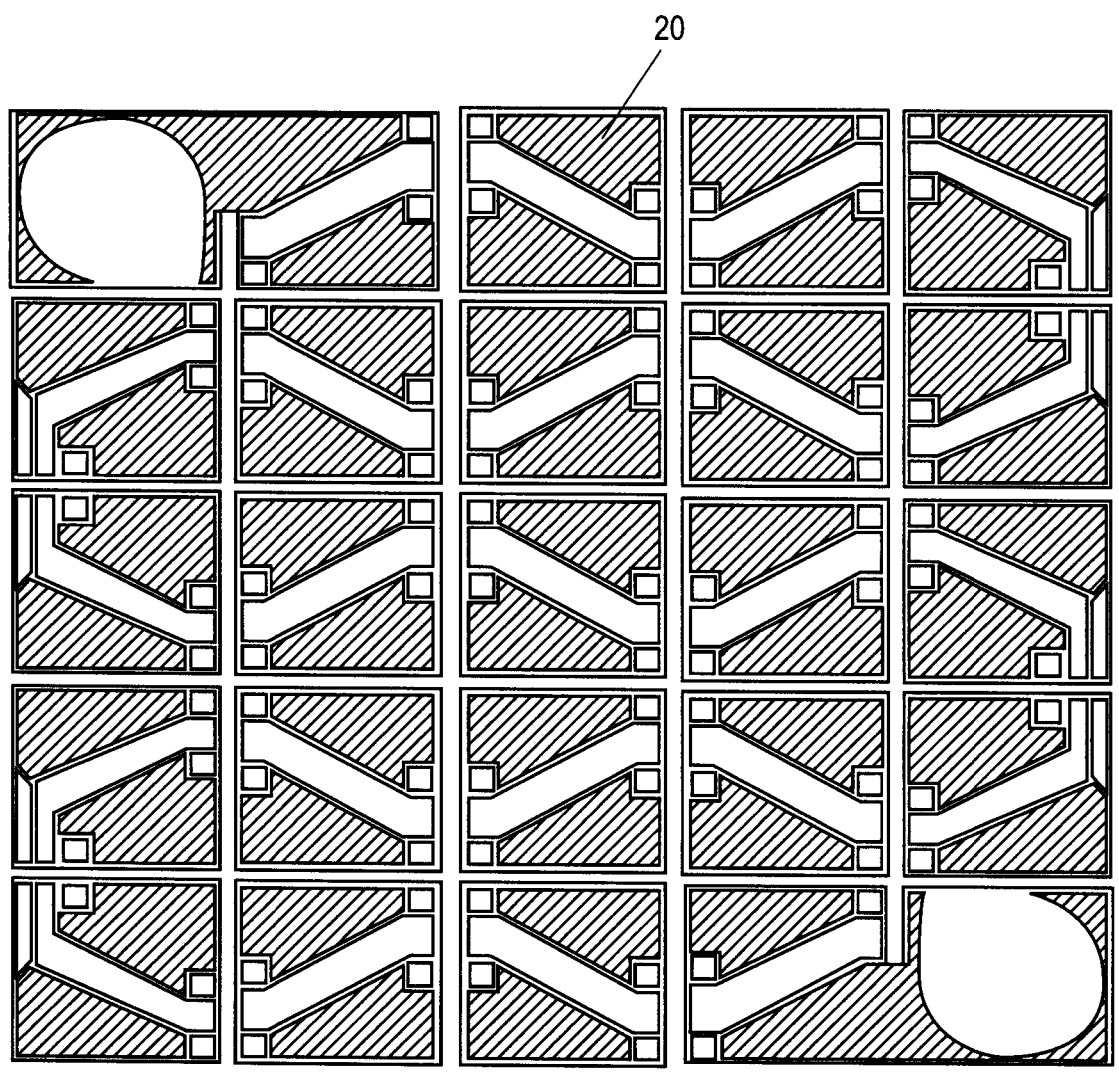
FIG. 4 is a bottom view showing an application of a plurality of the alternating current light emitting devices to a chip according to the present invention.

As shown in FIG. 4, when a plurality of micro diodes interlacing one another are arranged on a chip and are applied with alternating current, the light-emitting surface of the chip can take turns to emit light using, for example, a 60 Hz frequency, wherein the micro diodes can have the same or different wavelengths to emit light of the same or different colors (the active layers can have the same or different wavelengths to emit light of the same or different colors). If different wavelength characteristics are selected for the micro diodes 20, for example, the upper active layer emits green light and the lower active layer emits red light, the alternating current light emitting device may emit mixed light (e.g. the green light mixed with the red light) by enabling the upper active layer and the lower active layer to emit light alternatively. More specifically, if green light having a wavelength of 485 to 500 nm (for the upper active layer) is used together with red light having a wavelength 580 to 620 nm (for the lower active layer), the mixed light effect of the upper active layer and the lower active layer is similar to white light of black body radiation. Accordingly, the present invention not only provides an improved light emitting device that can emit light during full cycles of alternating current voltage, but also provides a device that can be adjusted to selectively emit a monochromatic light or mixed colors of light according to user's implementation and requirements. Therefore, the present invention offers advantages over the prior art technique.

Figure 5A:
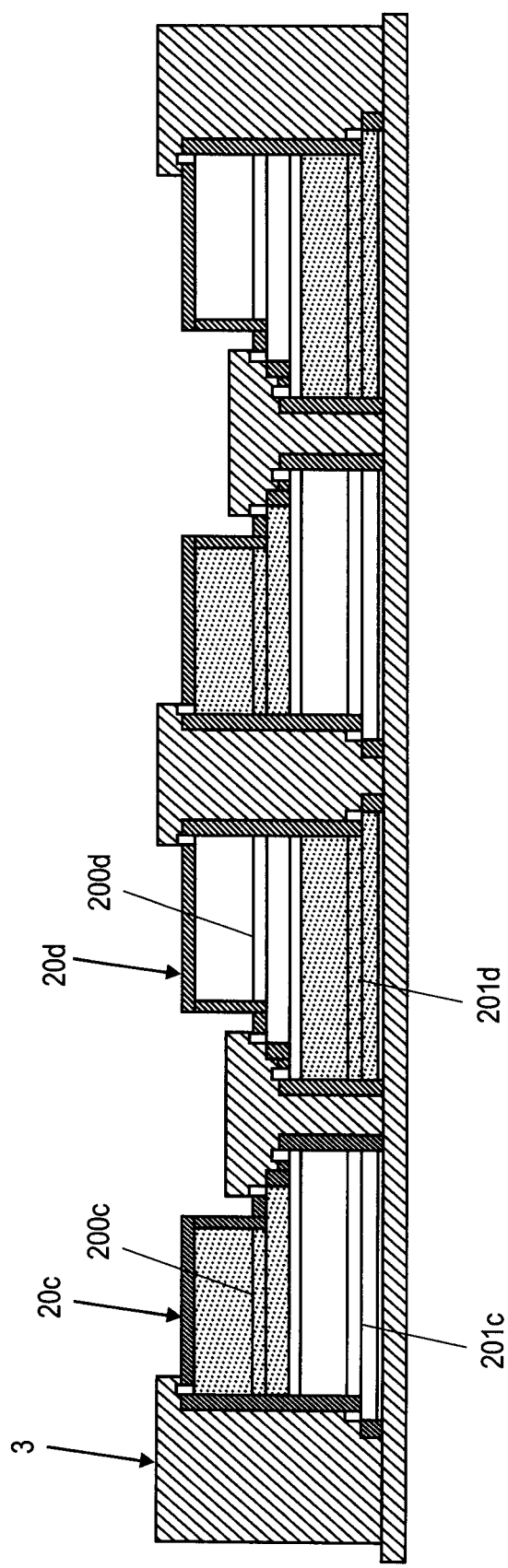
FIGS. 5A and 5B are schematic views showing an operation of the alternating current light emitting device of another embodiment according to the present invention.
Figure 5B:
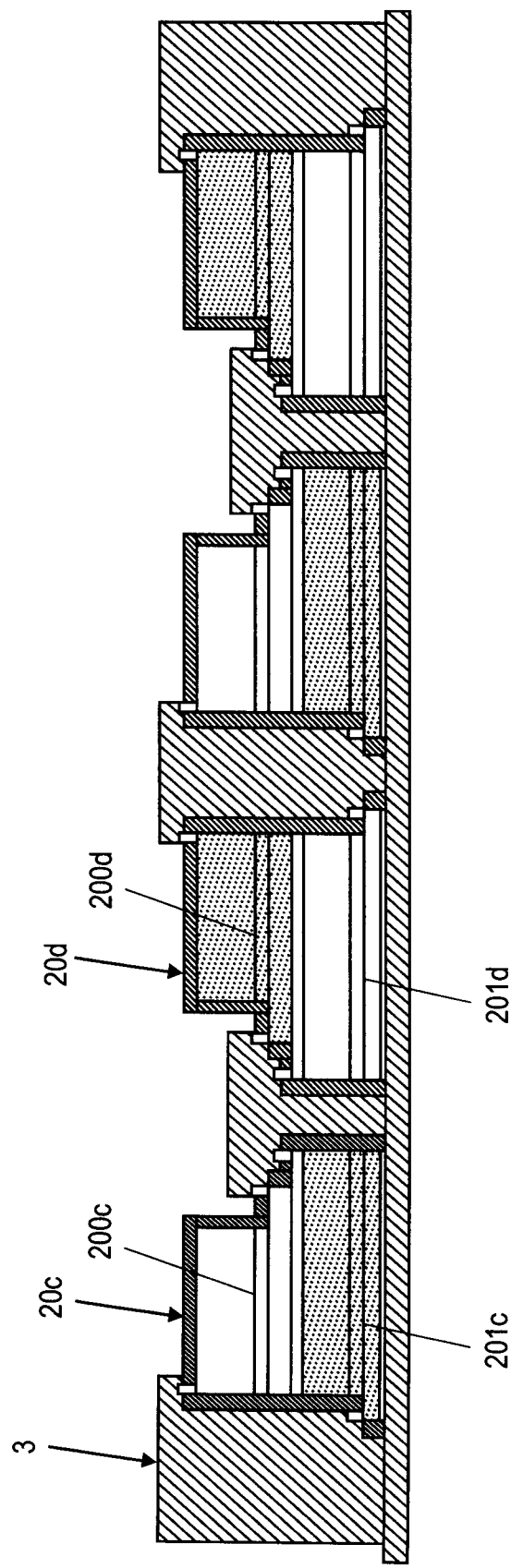
Figure 6A:
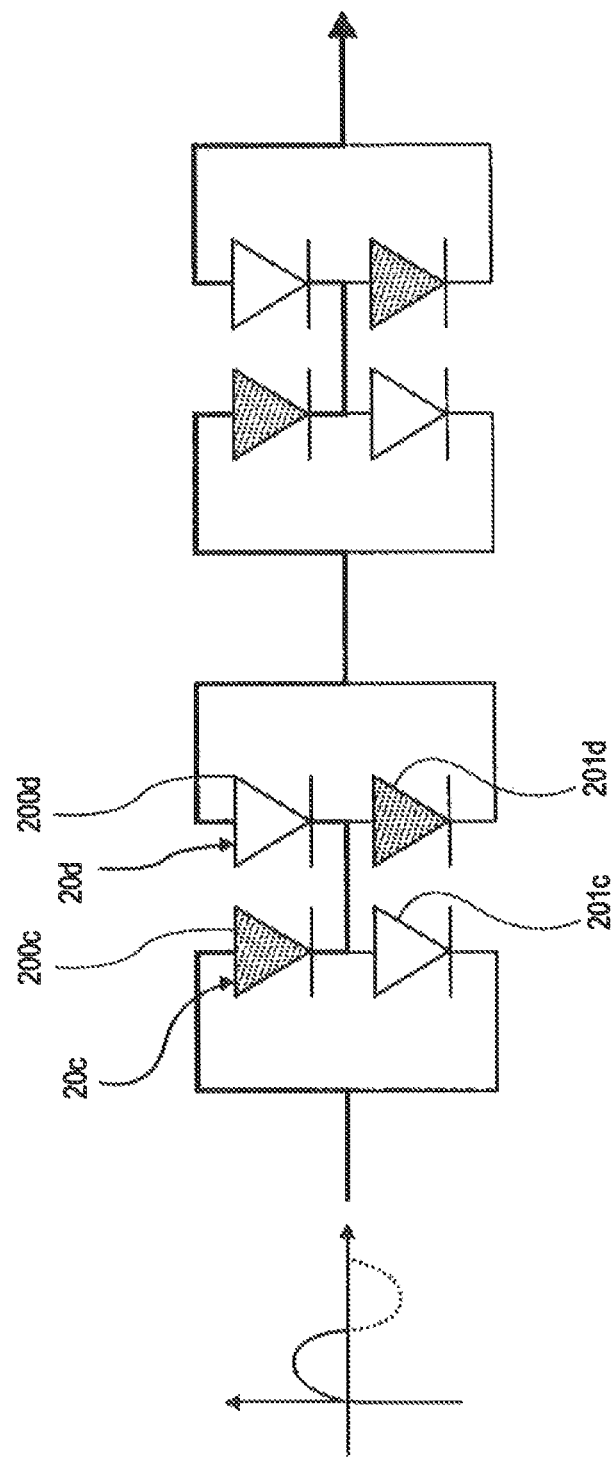
FIGS. 6A and 6B show respective circuitries of FIGS. 5A and 5B illustrating operations of another embodiment of the alternating current light emitting device according to the present invention.
Figure 6B:
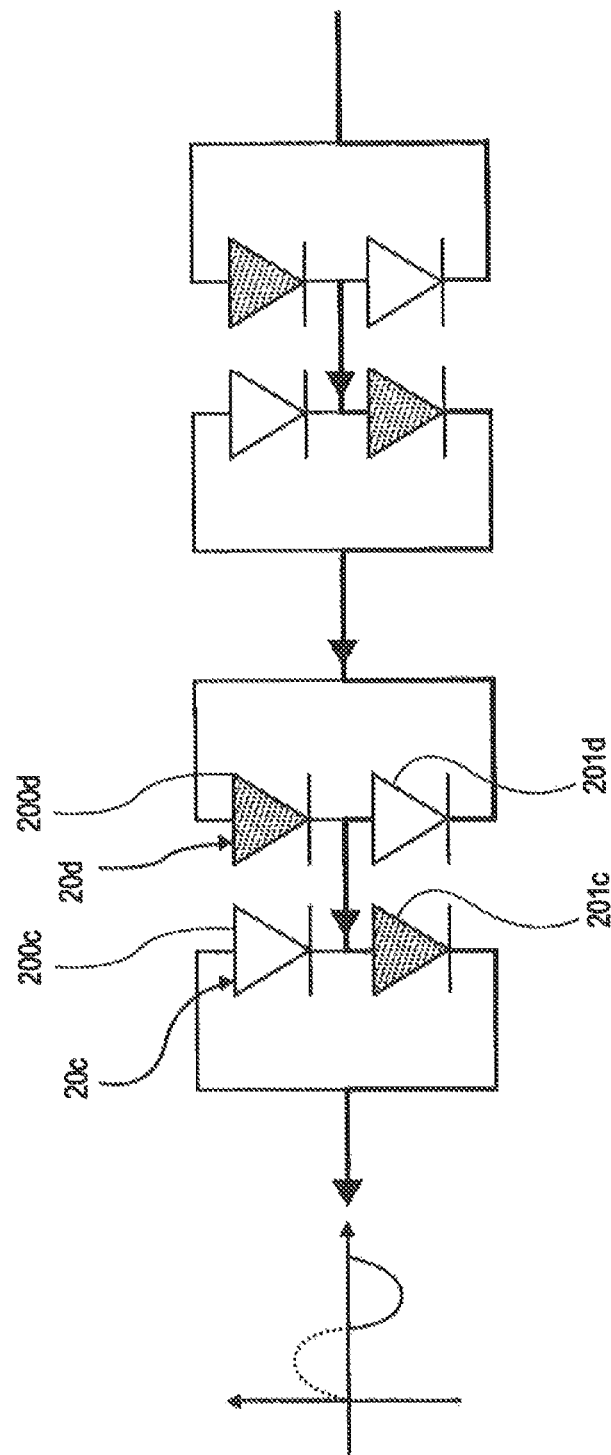

FIGS. 5A and 5B illustrate another application of the alternating current light emitting device of the invention and the corresponding equivalent circuitry thereof shown in FIGS. 6A and 6B, wherein each active layer (e.g. upper active layers 200c, 200d and lower active layers 201c, 201d) may be equivalent to a light emitting diode (LED) having a P/N structure, thereby making the upper active layers 200c and 200d and the lower active layers 201c and 201d of micro diodes 20c and 20d parallel connected while the micro diodes 20c and 20d are serially electrically connected by the conductive structure 3.

FIG. 5A and FIG. 6A illustrate a radiating status of the alternating current light emitting device during the positive half cycles of alternating current. During the positive half cycles of alternating current, different active layers of the adjacent micro diodes 20c and 20d may be forward biased (e.g. the upper active layer 200c of the micro diode 20c and the lower active layer 201d of the micro diode 20d). As a consequence, the positive half cycle of alternating current as shown by an arrow in FIG. 6A passes through different active layers of micro diodes 20c and 20d to enable each different active layer (e.g. the upper active layer 200c of the micro diode 20c and the lower active layer 201d of the micro diode 20d) to emit light. Similarly, during the negative half cycles of alternating current as shown in FIG. 5B and FIG. 6B, different active layers of the adjacent micro diodes 20c and 20d are forward biased (e.g. the upper active layer 200d of the micro diode 20d and the lower active layer 201c of the micro diode 20c). The negative half cycle of alternating current, as shown by an arrow in FIG. 6B, passes through different active layers of micro diodes 20c and 20d to enable each different active layer (e.g. the upper active layer 200d of the micro diode 20d and the lower active layer 201c of the micro diode 20c) to emit light. In other words, as it can be seen from the equivalent circuitry, the active layers of each micro diode (e.g. the upper active layer 200c and the lower active layer 201c of the micro diode 20c) may be equivalent to two light emitting diodes stacked together with opposite biased directions. It differs from the applications depicted in FIGS. 2A, 2B, 3A and 3B in that the different active layers of the micro diodes 20c and 20d take turns to emit light during the positive/negative half cycles of alternating current. A plurality of micro diodes are arranged in an interlacing manner on a chip to receive alternating current that empowers the light emitting surface of the chip to full-timely emit light.

Similarly, the micro diodes 20c and 20d as described above may have the same or different wavelengths (each active layer may also have the same or different wavelengths) in order to emit light of identical or different colors, wherein if active layers emit different wavelengths, such as the upper active layers 200c and 200d emit green light and the lower active layers 201c and 201d emit red light, the alternation of the light emitted from the different active layers (e.g. the upper active layer 200c to the lower active layer 201d or the upper active layer 200d to the lower active layer 201c) may achieve the effect of mixing colored light (such as red light plus green light, the application thereof is the same as the foregoing embodiment and thus will not be further detailed herein). Additionally, since the upper active layers 200c and 200d and the lower active layers 201c and 201d may emit light of different colors at a frequency of 120 Hz (60 Hz.times.2) that may practically exceed the highest human recognizable frequency 100 Hz, a more even of soft visual effect of mixing light may be provided. Accordingly, the full-timely light emitting device employed in this embodiment may not only comply with users' needs to flexibly adjust colors of emitting light but also produce more even and soft light for optimal visual effects.

Figure 7:
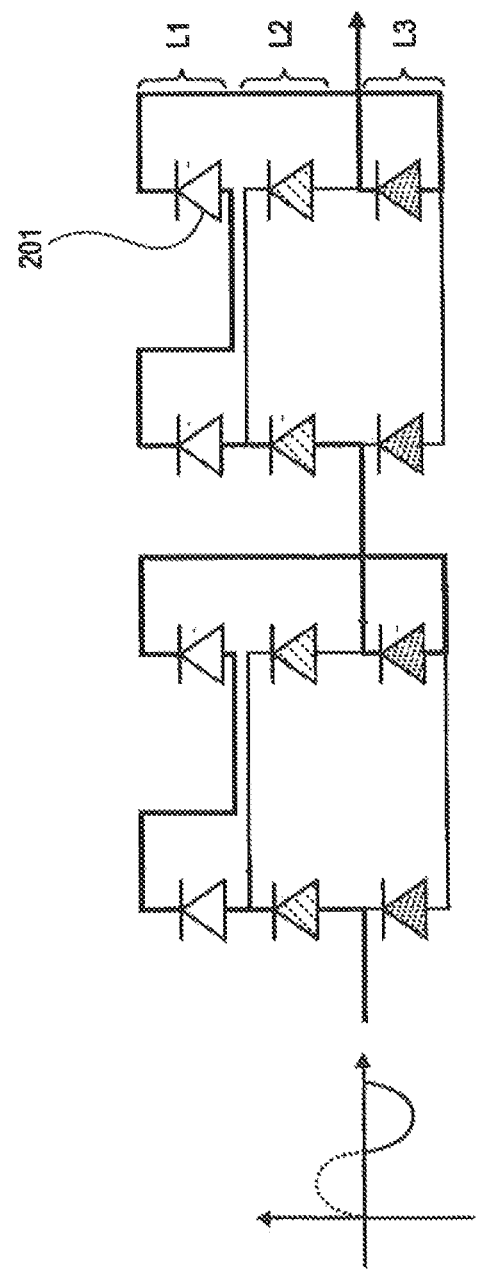
FIG. 7 is a three-layer equivalent circuitry showing a plurality of the alternating current light emitting devices of the present invention.

In the case that the alternating current light emitting device of the present invention is a structure having three active layers, an embodiment is shown in FIG. 7. It illustrates an equivalent circuitry (As described above, each active layer is equivalent to a light emitting diode in FIG. 7). When applying a positive half-cycle of alternating current as shown by an arrow, each active layer conducting the positive half-cycle of current will emit light (the route which the negative half-cycle of alternating current passes can be easily discerned from the route which the positive half-cycle of current passes and thus is not further detailed herein). An embodiment of this three-layer structure is implemented by having a first layer L1 to emit green light, a second layer L2 to emit blue light and a third layer L3 to emit red light (green, blue and red light are three primaries to produce white light). Based on FIG. 7, the colors produced during the positive half cycles of alternating current appear in the order (following the arrow from left to right) of blue, green, green, red, blue, green, green, red. The colors produced during the negative half cycles of alternating current also appear in the same order of blue, green, green, red, blue, green, green, red, but this time current flows from right to left to utilize the two blue and two red diodes that didn't conduct during the positive half-cycle (all of the green diodes emit light during the negative half-cycle just as during the positive half-cycle since human eye needs more green mixed in order to perceive white). Therefore, the alternating current light emitting device of the invention can employ and match different colors to achieve an overall desired color effect when the positive or negative half cycles of alternating current are applied to the active layers thereof. Also, in order for this three-layer structure to have an effect of producing white light (by mixing colors of emitted light), an example application is to mix green light at a 535 nm wavelength with blue light at a 460 nm wavelength and red light at a 630 nm wavelength. When three or more active layers are used to mix light, color temperature adjustments are required, one or more active layers can be made non-luminous by applying short circuits to meet the light mixing requirements in practical use.

Figure 8:
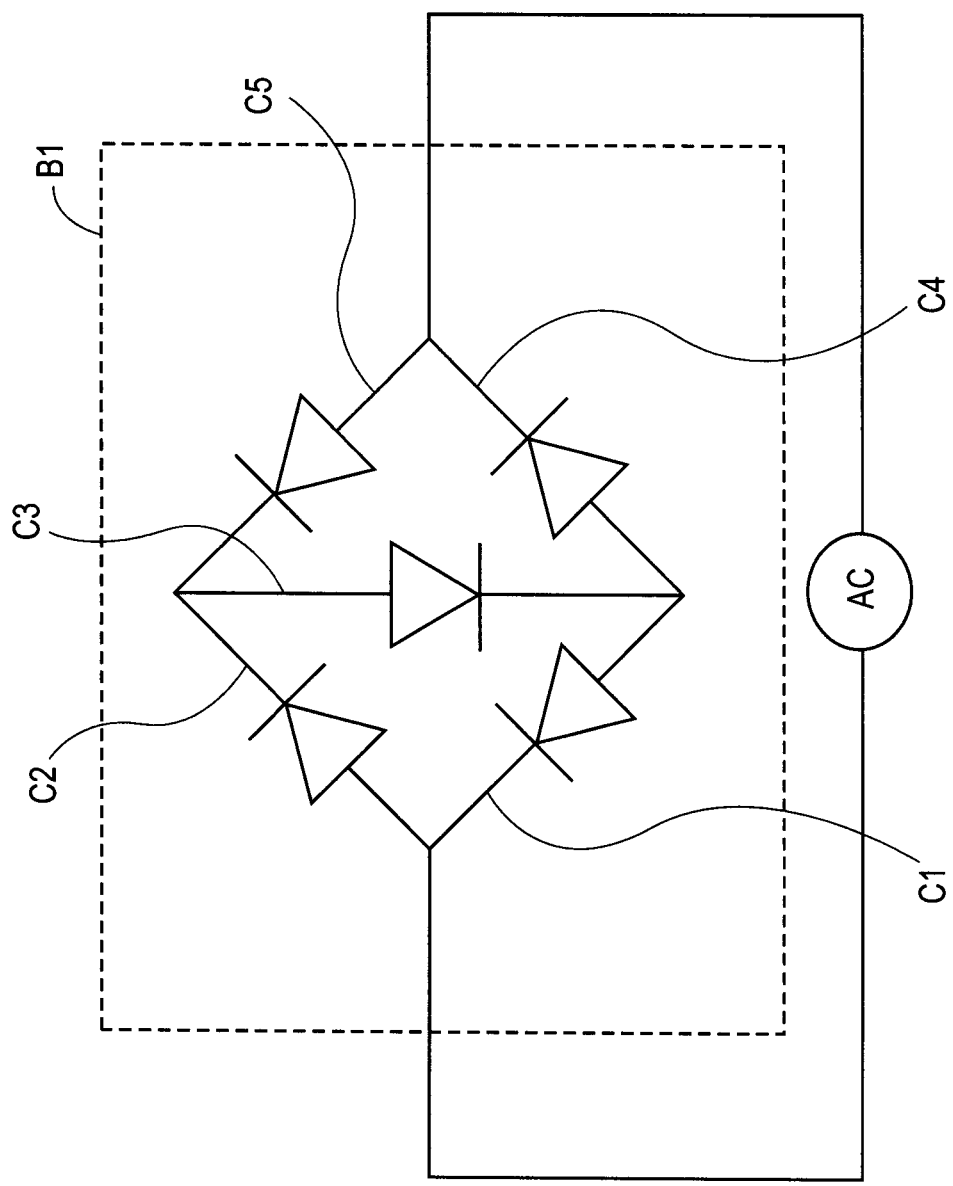
FIG. 8 shows a basic circuitry showing the micro diodes of the plurality of the alternating current light emitting devices of the present invention having at least one active layer with diodes being arranged according to the circuit configuration diodes in a Bridge Rectifier.

Furthermore, as shown in FIG. 8, each micro diode disclosed in the invention can have at least one active layer, These active layers can be arranged based on the circuit structure of the diodes in a bridge rectifier, wherein each active layer is electrically connected (as described above, an active layer is equivalent to a light emitting diode). An example application of this light-mixing effect is to mix colors of two or three layers (wherein the color mixing applications for two or three layers are the same as that described above and thus will be omitted herein).

Figure 9A:
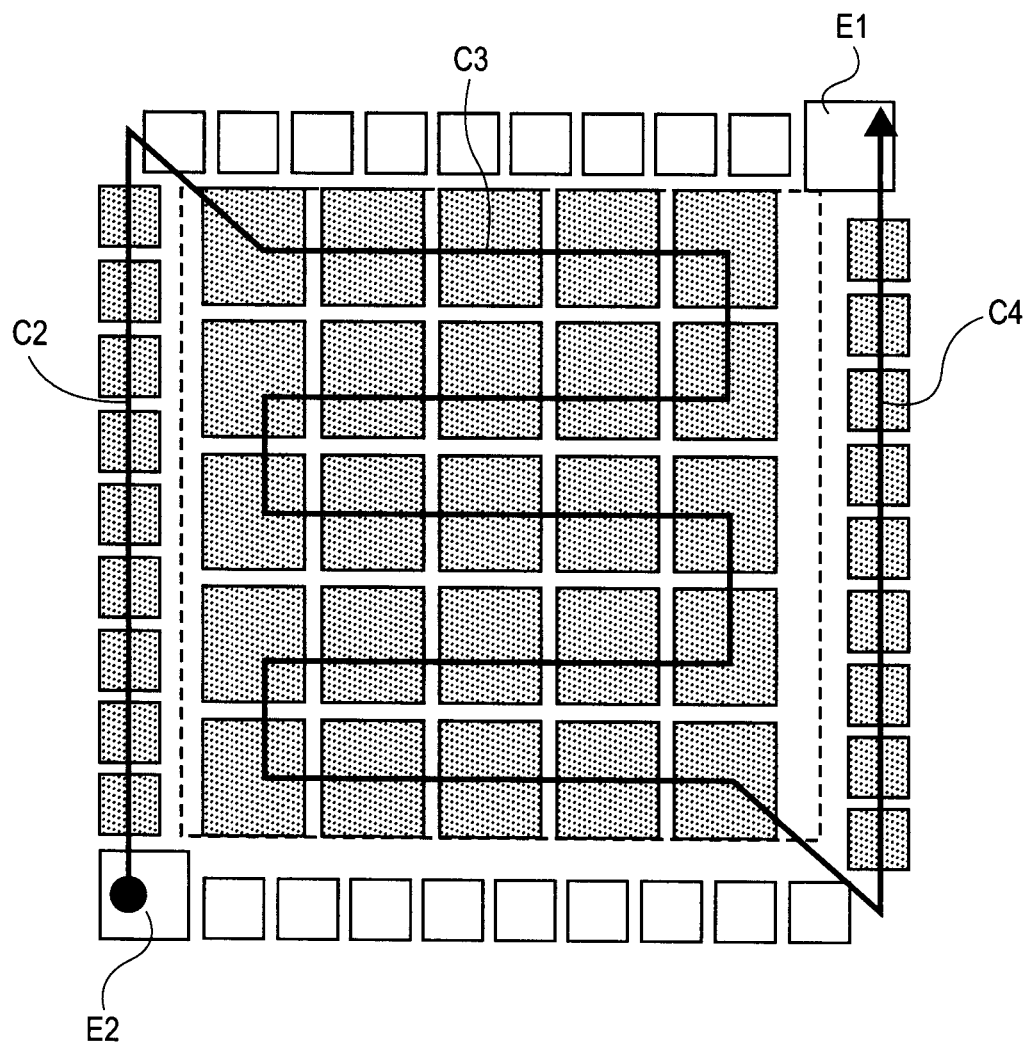
FIGS. 9A and 9B are, respectively, schematic diagrams showing the application of each half cycle of alternating current to a chip according to the circuit configuration of the preferred embodiment depicted in FIG. 8.
Figure 9B:
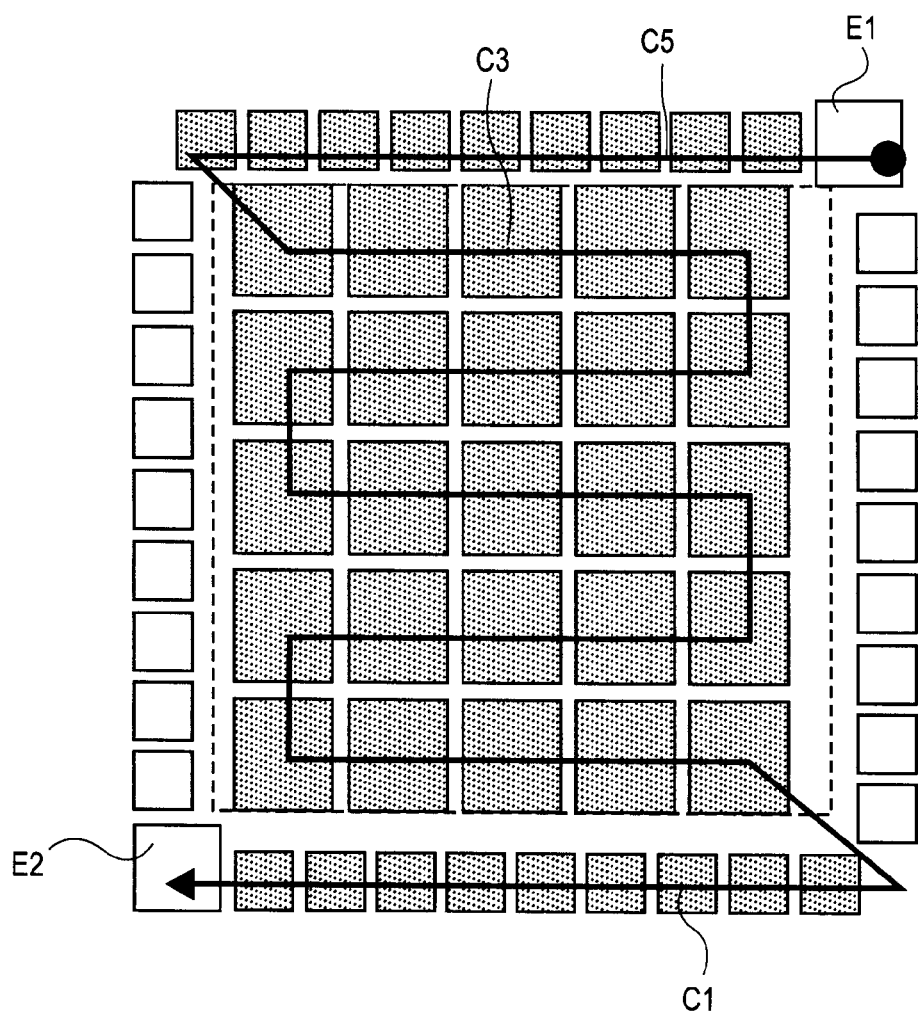

Also, as illustrated in FIG. 8, each of the electrically connected circuits arranged as per the foregoing circuit structure is defined as a first circuit C1, a second circuit C2, a third circuit C3, a fourth circuit C4 and a fifth circuit C5 for illustration purposes, wherein the light emitting colors and the number of active layers (equivalent to light emitting diodes) can be decided by users depending on the requirements. An example embodiment is to respectively dispose 10 active layers of the micro diodes on the first circuit C1, the second circuit C2, the fourth circuit C4, and the fifth circuit C5, and disposing 22 active layers of the micro diodes on the third circuit C3, wherein each alternating current light emitting micro diode comprises one or more active layers. The number of the active layers taking the alternating current reverse bias voltage in this kind of circuit structure arrangement is about half of the number of the active layers taking the alternating current forward bias voltage, therefore, if this structure uses a plurality of active layers to concurrently take the reverse bias voltage of alternating current, the reverse bias alternating current voltage will be evenly absorbed by the active layers (one active layer can take about 10-15 volts of reverse bias voltage) so as to prevent shorting or break-down that may occur due to breaking the active layers from excessive reverse bias voltage. Also, the effect of mixing colors to produce white light may be implemented according to the foregoing embodiments. In addition to making different active layers of the alternating current light emitting diodes emit different colors and flexibly selecting the number of the active layers, the configuration of the second circuit C2, the third circuit C3 and the fourth circuit C4 as shown in FIG. 9A conducting the positive half cycle of alternating current, and the configuration of the fifth circuit C5, the third circuit C3 and the first circuit C1 conducting the negative half cycle of alternating current as shown in FIG. 9B, are employed to dispose the third circuit to conduct both the positive and negative half cycles of alternating current on the light emitting surface of a chip, thereby achieving the effect of full-timely light emitting on the major light emitting area of the chip surface when conductive electrodes E1 and E2 are connected with alternating current (the conductive electrode E1 and E2 are electrically connected to the circuit). As the plurality of active layers of the micro diodes of the third circuit C3 can emit light during both the positive and negative half cycles of alternating current, the number of active layers used in prior art techniques can be reduced. For example, the number of active layers used in prior art techniques requires 22 layers for each of the positive and the negative half cycles of alternating current, making a total number of 44, while, in the present invention, only a total number of 22 active layers are required to achieve the effect of full-timely light emitting.

Figure 10A:
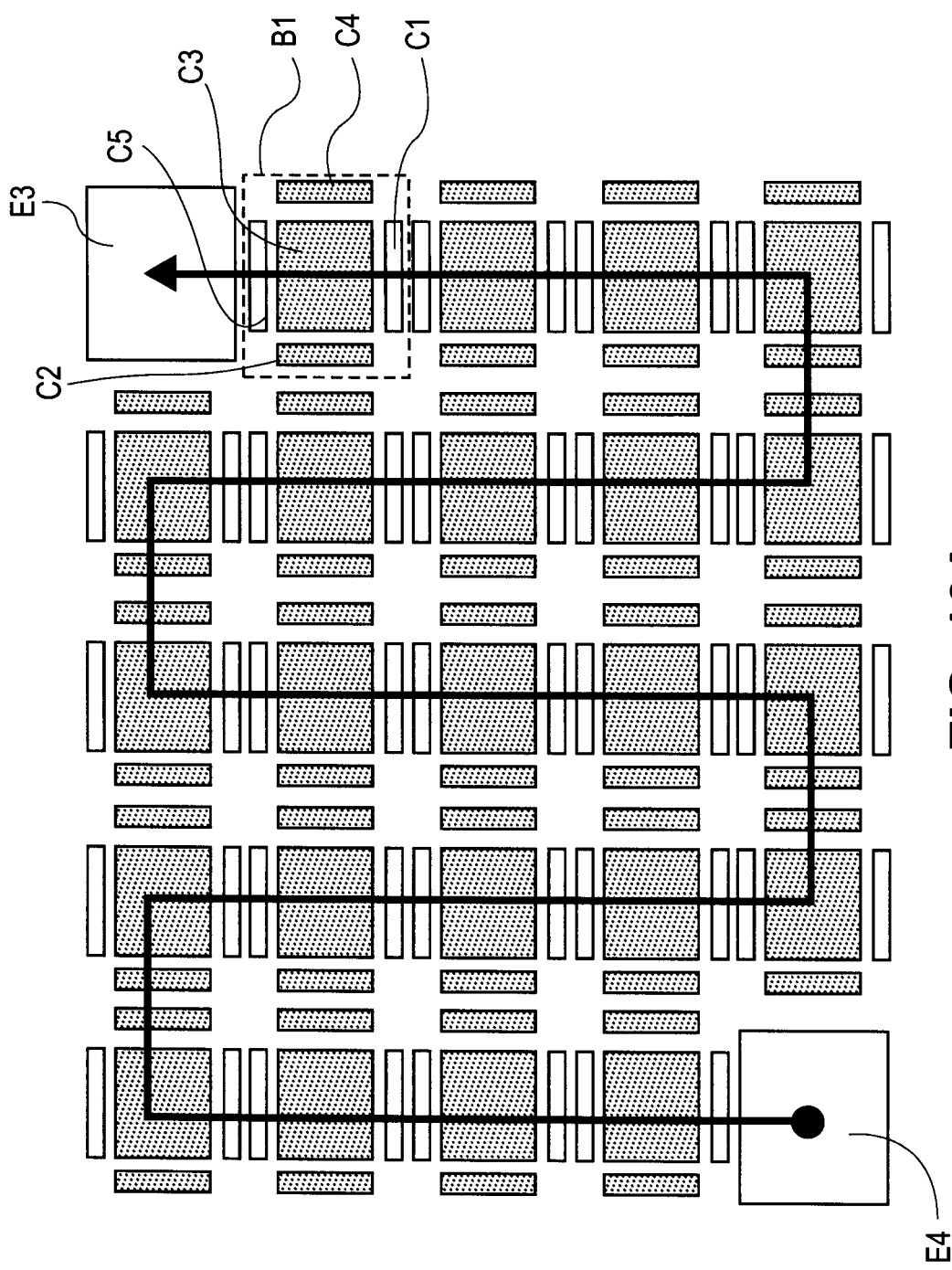
FIGS. 10A and 10B are, respectively, schematic diagrams showing the application of each half cycle of alternating current of half waves to a bridge rectifier with a plurality of bridge light emitting units to a chip using the circuit configuration of the embodiment depicted in FIG. 8.
Figure 10B:
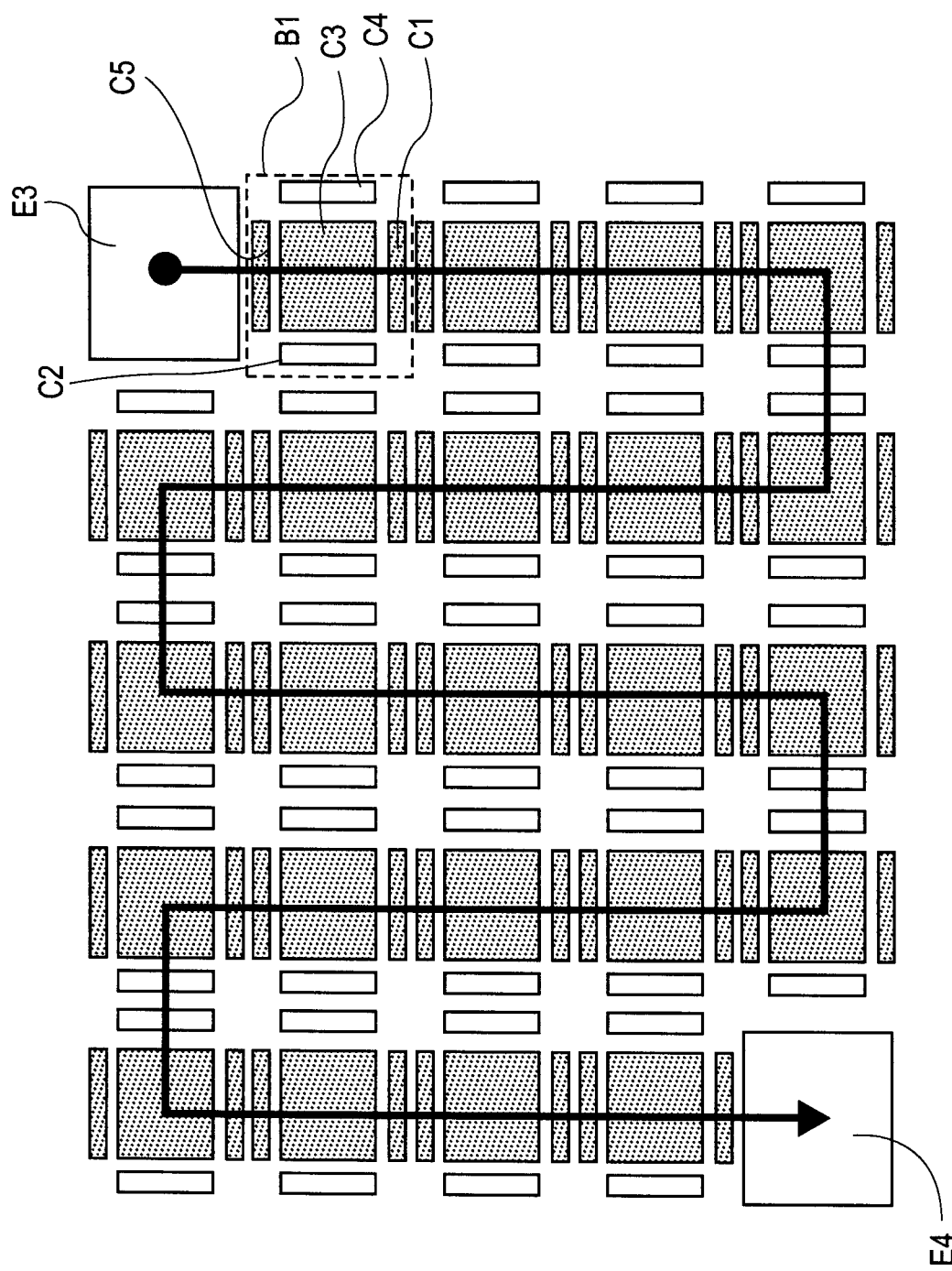

Furthermore, the foregoing circuit configuration of the active layers (equivalent to LEDs) can also be a bridge light emitting unit B1 as shown in FIG. 8, that is, active layers of micro diodes of the bridge light emitting unit B1 are arranged as per the diodes in a bridge rectifier to electrically connect to one another. A plurality of the bridge light emitting units B1 arranged in a matrix as shown in FIGS. 10A and 10B is disposed on the light emitting surface of a chip, the two diagonal corners of the matrix being disposed with two conductive electrodes E3 and E4 for connecting with alternating current (the two conductive electrodes E3 and E4 being serially connected with the bridge light emitting units B1), such that when connected to alternating current, the current of the positive or negative half cycles passes through most parts of the light emitting surface of the chip to emit light full-timely.

The circuit configuration as described above can also be applied to an alternating current light emitting device composed of micro diodes having a single active layer, such as forming bridge light emitting units composed of a plurality of alternating current light emitting diodes on a substrate, the circuit configuration of micro diodes being arranged as per the diodes in a bridge rectifier and being electrically connected to each micro diode through a conductive structure, thereby making the micro diodes to take turns to emit light during the positive and negative half cycles of alternating current. Alternatively, it can include a plurality of bridge light emitting units electrically connected to one another, each bridge light emitting unit being disposed as a part of a matrix to thereby achieving a full-timely and more even light emitting effect. Additionally, it further includes a step of disposing two conductive electrodes on the two diagonal corners of the matrix, each conductive electrode being serially connected to each bridge light emitting unit (e.g. the bridge light emitting unit B1) to provide a connection to an alternating current. Since the circuit structure thereof is similar to what described above, it will not be further detailed herein.

The active layers (as mentioned above, each active layer is equivalent to a LED) disclosed by the present invention can be applied directly to the relative circuits of switch circuits or indicating circuits without adding external load, and a plurality of active layers is configured in a parallel connection and then the parallel connections are serially connected to each other so as to achieve various lighting applications. Moreover, the active layers can be applied to LCD Backlight devices as disclosed by USP 2005/0001537, USP 2004/0246696, and JP 2004-333583 A. The active layers can also be implemented by a variety of manufacturing processes, such as the 5φ LED conducting wire stand glue-irrigating packaging process; the Super Flux conducting wire stand glue-irrigating packaging process; the Flip-Chip, ceramics and aluminum substrate manufacturing processes; the PPA point-gluing, injection packaging process; or the To metal shell packaging process, and so forth.

Figure 11A:
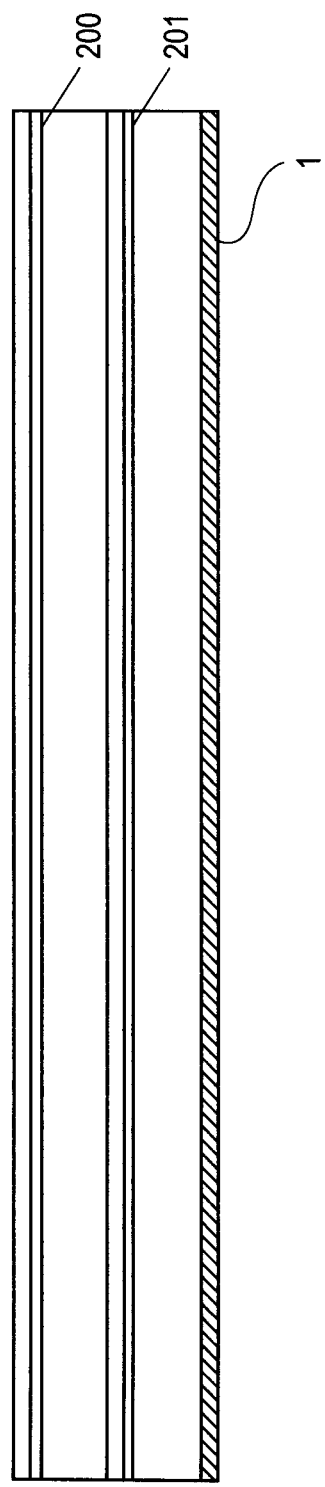
FIGS. 11A through 11E are structural flowcharts showing, collectively, a fabrication method of the alternating current light emitting devices of the present invention.
Figure 11B:
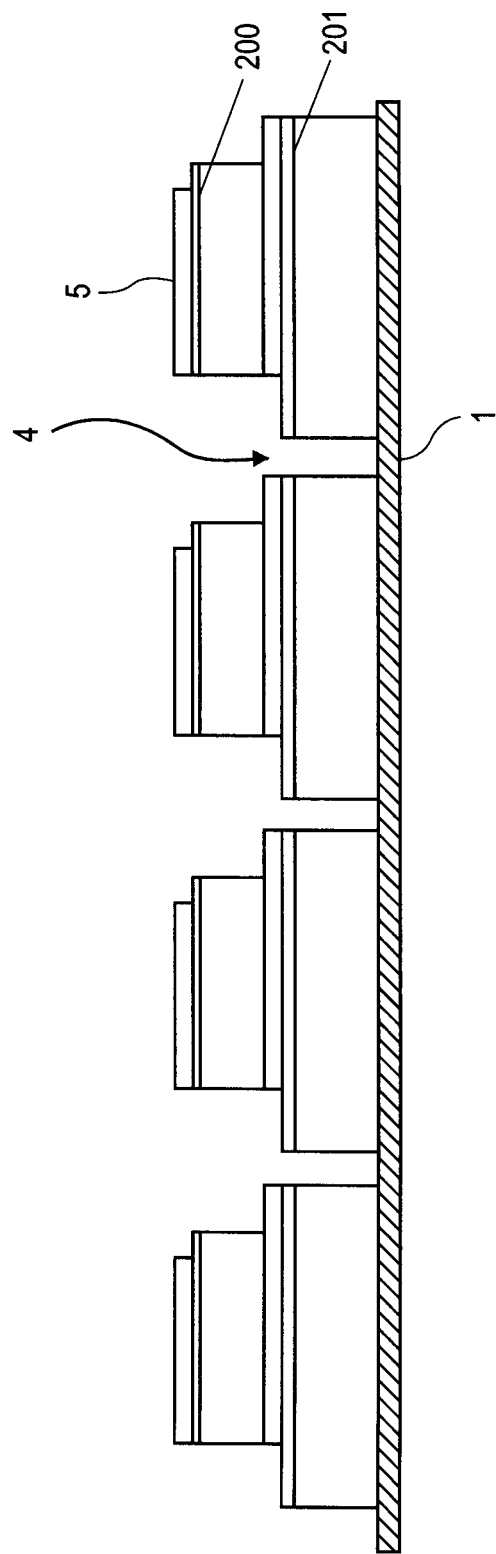
Figure 11C:
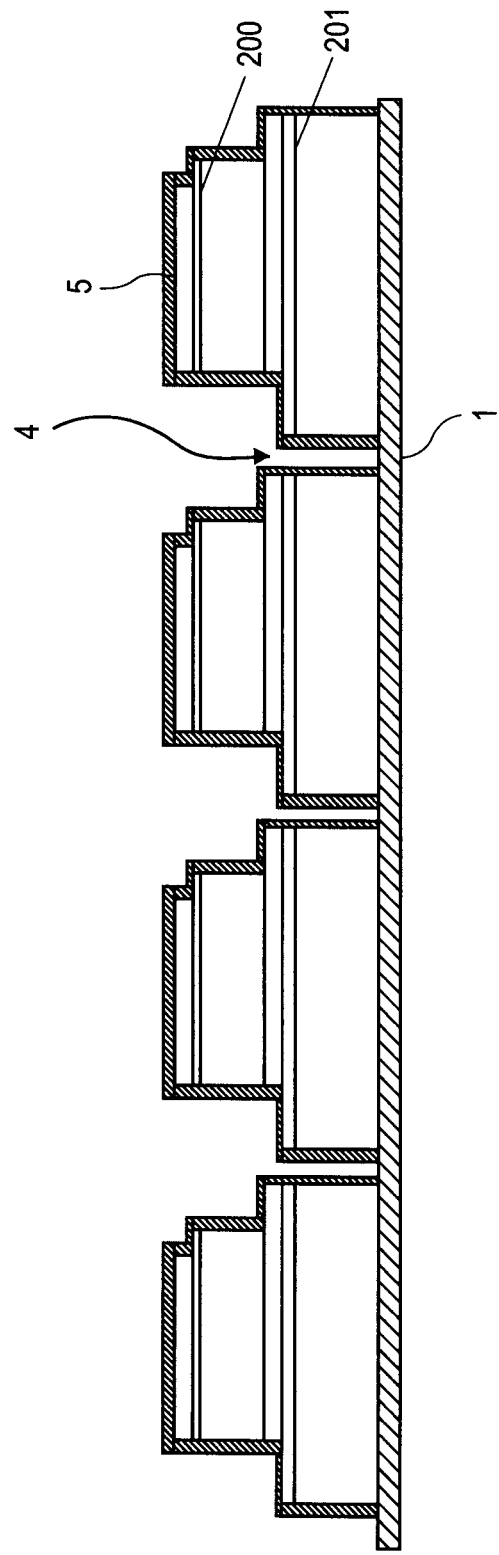
Figure 11D:
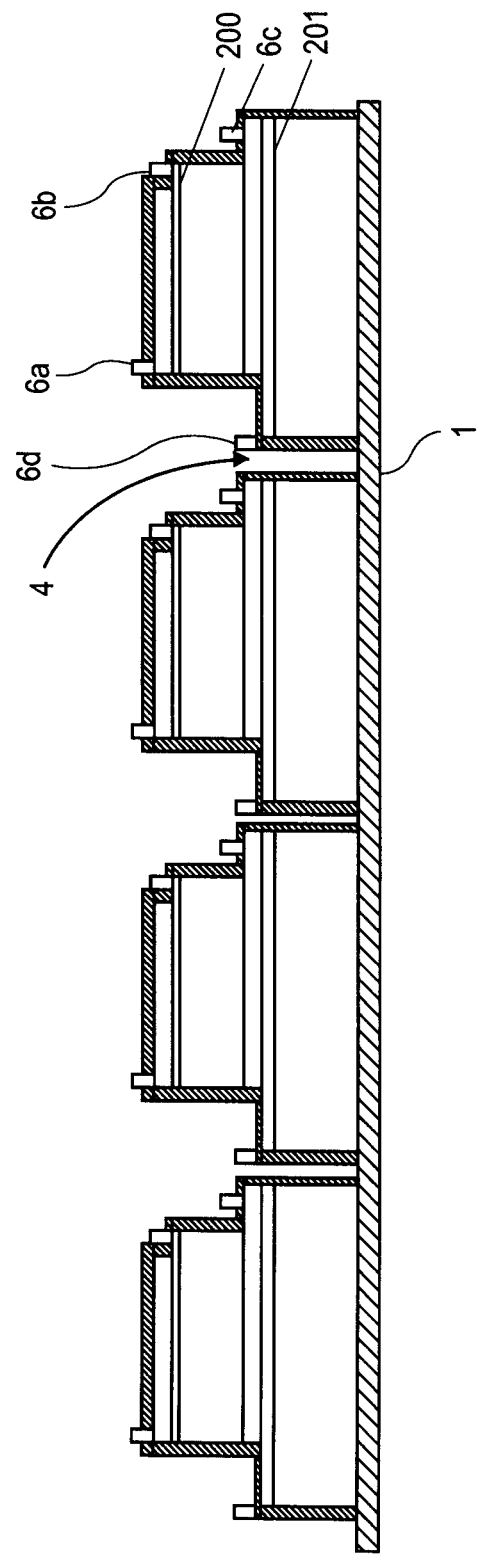
Figure 11E:
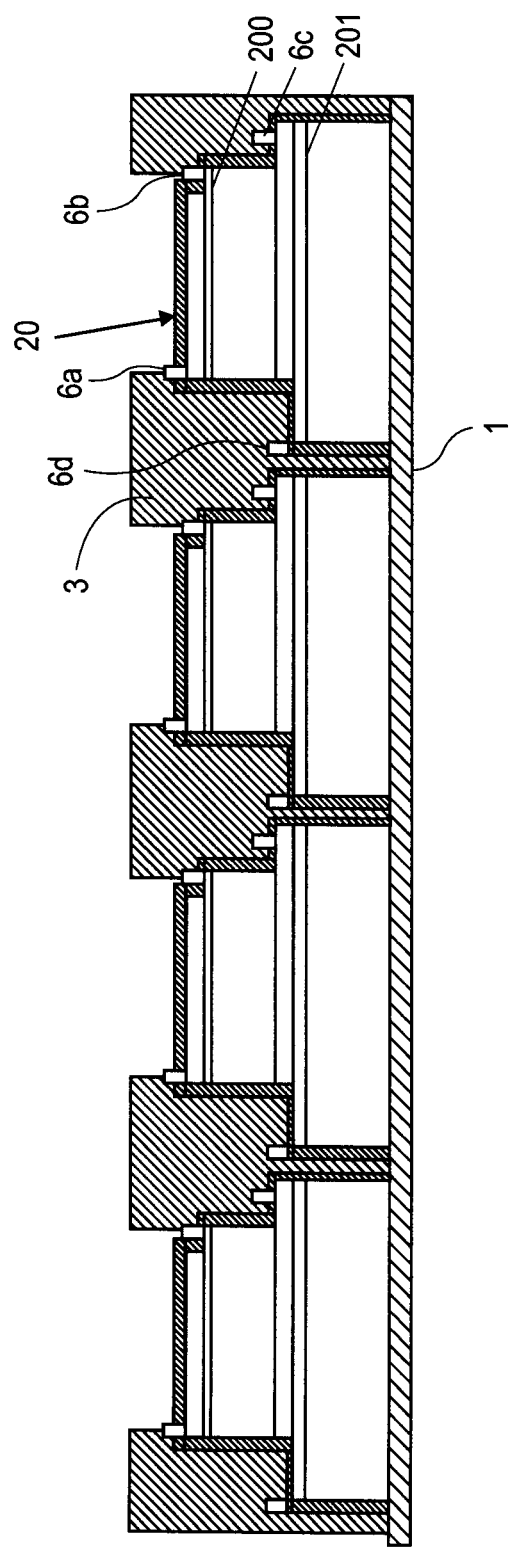
Figure 12A:
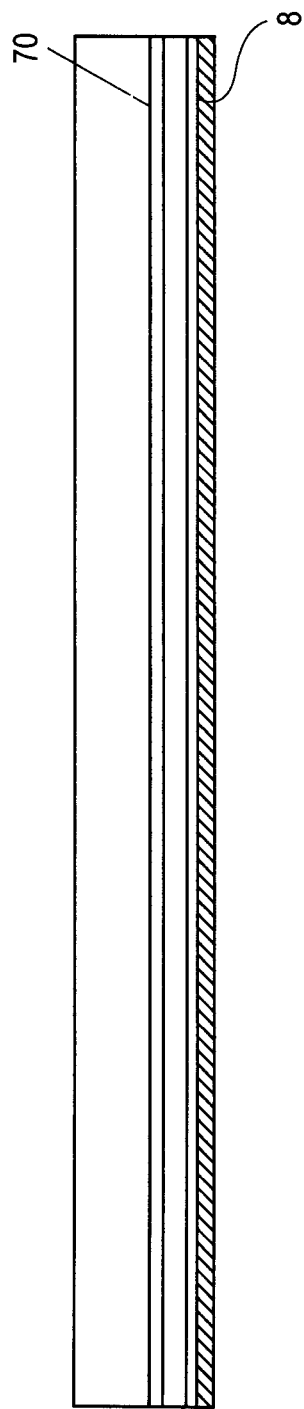
FIG. 12A through 12F are structural flowcharts showing, collectively, another fabrication method of the alternating current light emitting devices of the present invention.
Figure 12B:
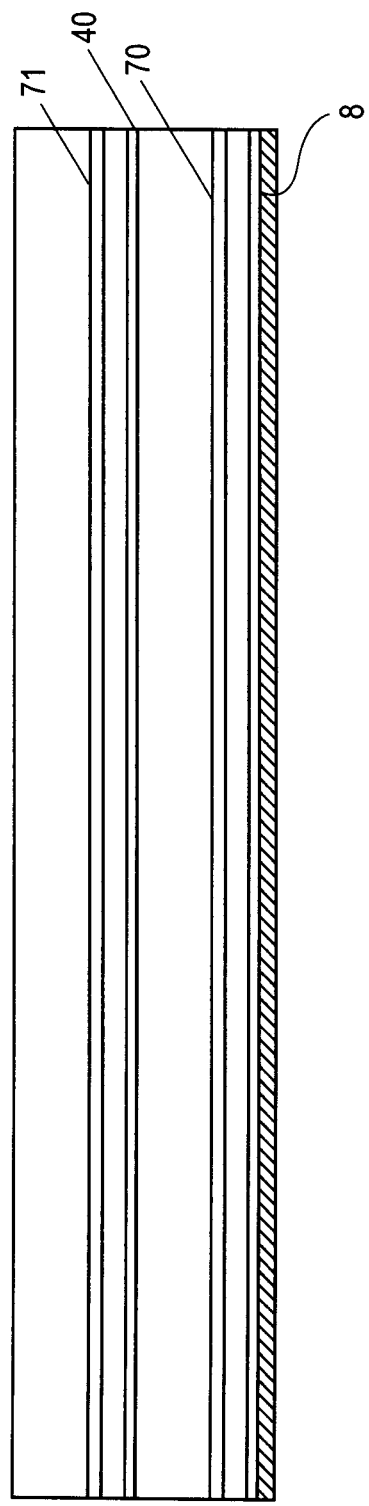
Figure 12C:
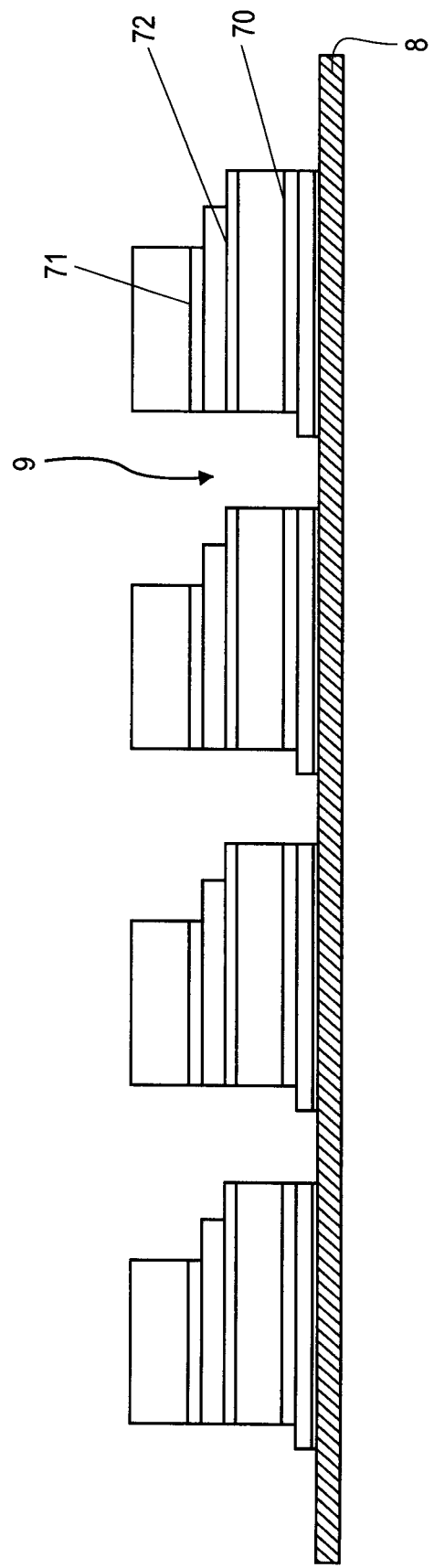
Figure 12D:
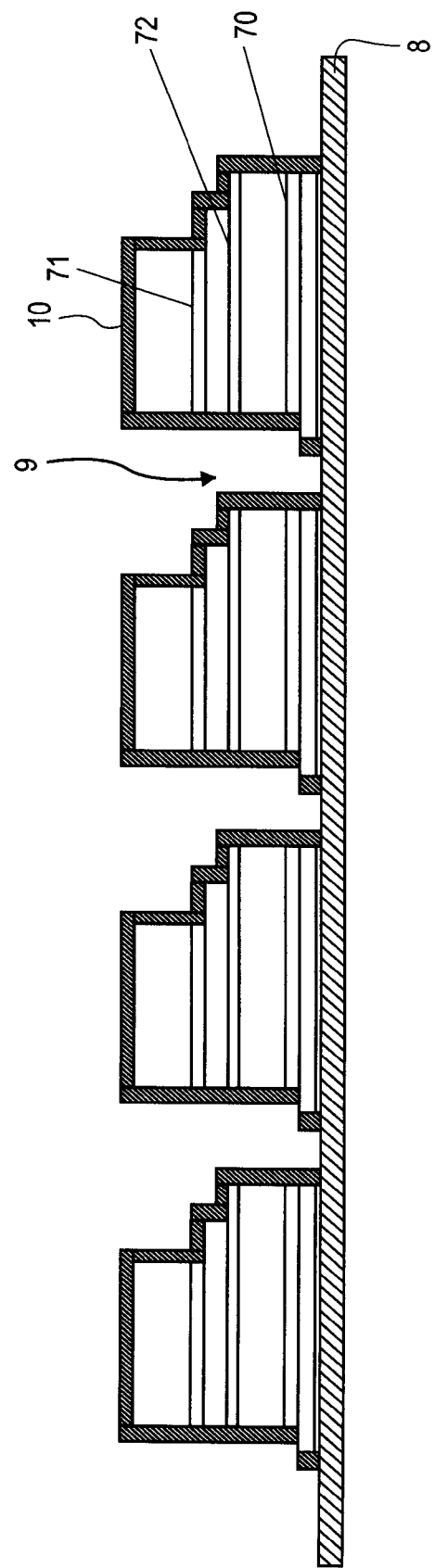
Figure 12E:
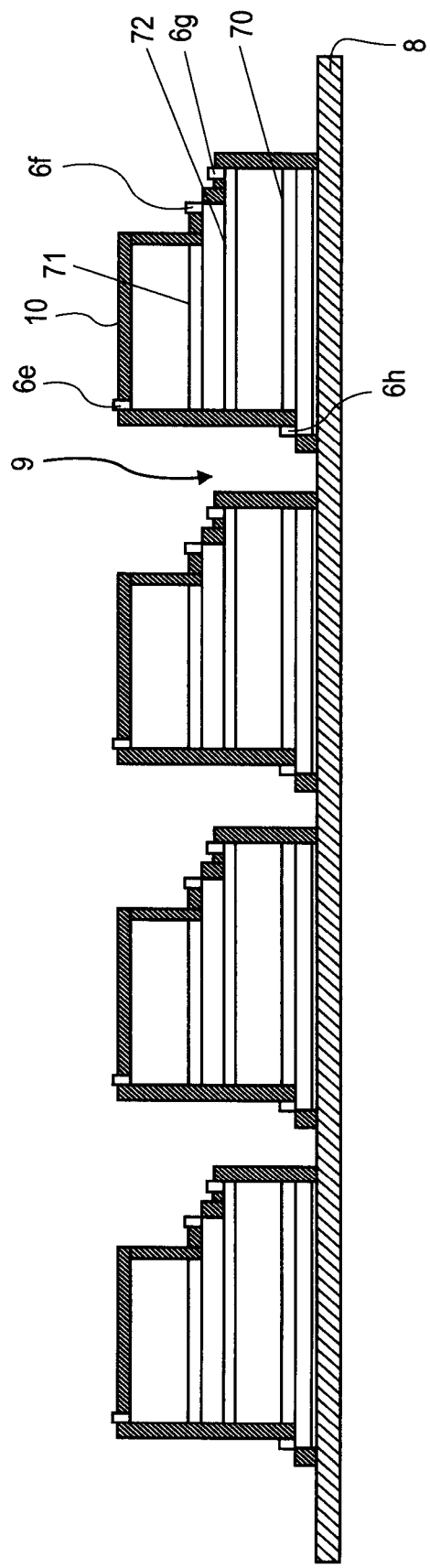
Figure 12F:
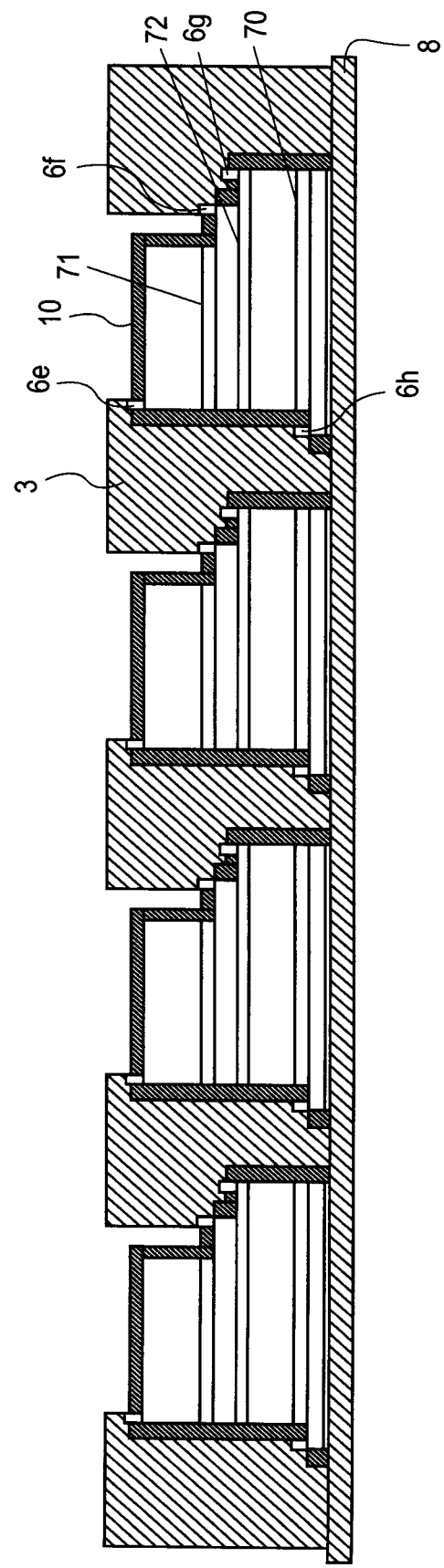

The present invention further provides a fabrication method for the alternating current light emitting device as shown in FIGS. 11A through 11E. Referring to FIG. 11A, the fabrication method comprises the steps of: preparing a substrate 1 and forming at least two active layers on the substrate in an epitaxial manner (e.g. an upper active layer 200 and a lower active layer 201 as shown in the drawing). The active layers are equivalent to light emitting diodes having P/N structure. The active layers are preferably implemented using P—InGaN/N—InGaN. Subsequently, as shown in FIG. 1B, a plurality of openings (e.g. an opening 4) is formed on the active layers (e.g. the upper active layer 200 and the lower active layer 201) by yellow light photolithography and etching techniques to expose the substrate 1. Then, as shown in FIG. 11C, the outer periphery of the active layers (e.g. the upper active layer 200 and the lower active layer 201) is covered by a protection layer 5 for preventing leakage of current, the protection layer 5 being composed of dielectric materials, such as SiOx or SiNx, and so forth. Following that, as shown in FIG. 11D, a plurality of conductive terminals 6a, 6b, 6c, and 6d is formed through the protection layer 5 so as to electrically connect to the active layers (e.g. the upper active layer 200 and the lower active layer 201). Finally, as shown in FIG. 11E, a plurality of conductive structures (e.g. the conductive structure 3) are formed in the openings (e.g. the opening 4) to electrically connect to the active layers (e.g. the upper active layer 200 and the lower active layer 201) so as to enable them to take turns to emit light during the positive or negative half cycles of alternating current. As the application of substrate 1, the active layers (e.g. the upper active layer 200 and the lower active layer 201), and the conductive structures (e.g. the conductive structure 3) mentioned in the fabrication method are same as those shown in FIGS. 2A, 2B, 3A, and 3B, therefore the description thereof will be omitted herein.

The plurality of conductive terminals 6a, 6b, 6c, and 6d is formed by means of evaporation and can be Ohmic electrodes electrically connected to the active layers (e.g. the upper active layer 200 and the lower active layer 201) to form a micro diode 20, which may have identical or different wavelengths as mentioned above.

Accordingly, FIGS. 12A through 12F illustrate a fabrication method of the alternating current light emitting device of the present invention. The method comprises the steps of: preparing a first substrate (not shown), forming a first active layer 70 on the first substrate, and removing the first substrate; then, referring to FIG. 12A, the first active layer 70 is formed on a second substrate 8, and, further referring to FIG. 12B, a second active layer 71 is formed on the first active layer 70 with a connection layer 72 formed between the first active layer 70 and the second active layer 71. The connection layer 72 comprises conductive and non-conductor materials and is transparent; then, referring to FIG. 12C, a plurality of openings 9 are formed on the first active layer 70 and the second active layer 71 by yellow-light photolithography and etching techniques so as to expose the second substrate 8; then, referring to FIG. 12D, a protective layer 10 is formed on the outer peripheral region of the first active layer 70 and the second active layer 71 to prevent leakage of electric current. The protective layer 10 comprises dielectric materials such as SiOx, SiNx and so on; then, referring to FIG. 12E, a plurality of conductive terminals 6e, 6f, 6g, and 6h are formed through the protective layer 10 to electrically connect to the first active layer 70 and the second active layer 71; finally, referring to FIG. 12F, a plurality of conductive structures (e.g. the conductive structure 3) are formed in the openings 9 to electrically connect to the first active layer 70 and the second active layer 71 so as to enable them to take turns to emit light via the positive or negative half cycles of alternating current. As the second substrate 8, the active layers (e.g. the first active layer 70 and the second active layer 71) and the conductive structures 3 are substantially similar in structure to those embodiments described in FIGS. 2A, 2B, 3A, and 3B, thus they will not be further detailed herein.

Similarly, the plurality of conductive terminals 6e, 6f, 6g, and 6h are formed by the same evaporation technique as the foregoing method and can be Ohmic electrodes to electrically connect to the active layers (the first active layer 70 and the second active layer 71) to form a micro diode 20 that may have the same or different wavelengths.

In summary of the above, the alternating current light emitting device disclosed by the present invention is composed of micro diodes and each micro diode comprises at least one active layers (preferably two or three layers), such that each active layer of the micro diode can take turns to emit light during the positive or negative half cycles of alternating current, thereby possessing a full-scale and full-timely light emitting characteristic. Furthermore, the structural application of the active layers disclosed by the present invention can be applied to different circuit configurations to achieve the optimal effect of mixing light and full-timely light emission as required.

The present invention has been described using the foregoing exemplary embodiments. All modifications and variations of equal functions without violating the principle and technology of the present invention should be included in the scope of the claims to be described below.

What is claimed is:

1. A light emitting device, comprising:
   a substrate;
   a light emitting module configured to receive an alternating-current input, the light emitting module being formed on the substrate and having at least two micro diodes, each micro diode having a lower active layer and an upper active layer formed over the lower active layer, the lower active layer being larger than the upper active layer; and
   a conductive structure formed over the substrate and the lower active layers of the at least two micro diodes, between the at least two micro diodes, and electrically connected to the at least two micro diodes so as to allow the lower and upper active layers of each of the at least two micro diodes to alternately emit light during positive and negative cycles of the alternating-current input.

2. The light emitting device of claim 1, wherein the substrate comprises a chip.

3. The light emitting device of claim 1, wherein the substrate comprises an insulating substrate.

4. The light emitting device of claim 1, wherein each of the lower and upper active layers comprises a luminescent active layer.

5. The light emitting device of claim 1, wherein the conductive structure comprises a conductor electrically connecting the at least two micro diodes.

6. The light emitting device of claim 1, wherein the conductive structure is formed as a conductive bridge electrically connecting the at least two micro diodes.

7. The light emitting device of claim 1, wherein the at least two micro diodes or the lower and upper active layers of the micro diodes emit light at identical or different wavelengths.

8. The light emitting device of claim 1, wherein the lower and upper active layers of the at least two micro diodes have individual ohmic electrodes.

9. The light emitting device of claim 1, wherein the upper active layers of one micro diode and its adjacent micro diode alternately emit light during the positive and negative half cycles of the alternating-current input, and the lower active layers of one micro diode and its adjacent micro diode alternately emit light during the negative and positive half cycles of the alternatinq-current input.

10. The light emitting device of claim 1, wherein the upper active layer of one micro diode and the lower active layer of its adjacent micro diode alternately emit light during the positive and negative half cycles of the alternating-current input.

11. The light emitting device of claim 1, wherein the at least two micro diodes are fabricated by one of a flip-chip, wafer bonding or an epitaxy technique.

12. The light emitting device of claim 1, further comprising a connection layer between the lower and upper active layers.

* * * * *